United States Patent
Fischer et al.

(10) Patent No.: US 8,473,796 B2
(45) Date of Patent: Jun. 25, 2013

(54) ERROR DETECTION IN COMPRESSED DATA

(75) Inventors: Martin Fischer, Heilbronn (DE); Domenico Chindamo, Rome (IT)

(73) Assignee: Advantest (Singapore) Pte Ltd, Singapore (SG)

( * ) Notice: Subject to any disclaimer, the term of this patent is extended or adjusted under 35 U.S.C. 154(b) by 2057 days.

(21) Appl. No.: 11/342,177

(22) Filed: Jan. 27, 2006

(65) Prior Publication Data

US 2006/0212770 A1 Sep. 21, 2006

(30) Foreign Application Priority Data

Mar. 11, 2005 (EP) ..................................... 05101918

(51) Int. Cl.
*G01R 31/28* (2006.01)

(52) U.S. Cl.
USPC .......................................... 714/732; 714/736

(58) Field of Classification Search
USPC ................................. 714/732, 736
See application file for complete search history.

(56) References Cited

U.S. PATENT DOCUMENTS

| | | | |
|---|---|---|---|
| 5,453,995 A | 9/1995 | Behrens | 371/27 |
| 5,499,248 A | 3/1996 | Behrens et al. | 371/22.1 |
| 5,930,270 A * | 7/1999 | Forlenza et al. | 714/736 |
| 6,067,651 A | 5/2000 | Rohrbaugh et al. | 714/738 |
| 6,578,169 B1 * | 6/2003 | Le et al. | 714/736 |
| 6,948,096 B2 | 9/2005 | Parvathala et al. | 714/30 |
| 2003/0005389 A1 * | 1/2003 | Ernst et al. | 714/798 |
| 2003/0229838 A1 * | 12/2003 | Hiraide | 714/738 |

FOREIGN PATENT DOCUMENTS

| | | |
|---|---|---|
| EP | 0 472 818 | 3/1992 |
| EP | 0 859 318 A1 | 8/1998 |
| EP | 0 864 977 A1 | 9/1998 |
| EP | 0 882 991 A1 | 12/1998 |
| EP | 0 886 214 A1 | 12/1998 |

* cited by examiner

*Primary Examiner* — Steve Nguyen

(57) ABSTRACT

A device under test—DUT—, comprising the steps of receiving a first data sequence from the DUT in response to a first stimulus signal, wherein the data of a plurality of internal data sequences of the DUT is compressed into the first data sequence, comparing the first data sequence with expected data and for detecting errors in the first data sequence, and providing a second stimulus signal to the DUT in order to instruct the DUT to generate a second data sequence that comprises uncompressed data of the plurality of the internal data sequences at the positions where the errors have been detected.

6 Claims, 4 Drawing Sheets

| t \ T2 | T23 | T22 | T21 |
|---|---|---|---|
| t1 | 1 | 0 | 1 |
| t2 | 1 | 0 | 1 |
| t3 | 1 | 0 | 1 |
| t4 | 0 | 1 | 1 |
| t4' | 0 | 1 | 1 |
| t4'' | 0 | 1 | 1 |
| t4''' | 0 | 1 | 1 |
| t5 | 1 | 0 | 1 |
| t6 | 1 | 0 | 1 |
| t7 | 0 | 1 | 1 |
| t7' | 0 | 1 | 1 |
| t7'' | 0 | 1 | 1 |
| t7''' | 0 | 1 | 1 |
| t8 | 1 | 0 | 1 |
| ... | | | |

Fig.3

ERROR DETECTION IN COMPRESSED DATA

BACKGROUND ART

1. Field of the Invention

The present invention relates to detecting errors in compressed data.

2. Discussion of the Background Art

Integrated Circuits (IC) need to be tested to assure proper operation. During test, the IC, as a device under test (DUT), is exposed to stimulus data signals of an Automatic Test Equipment (ATE). The IC transmits corresponding response data back to the ATE. The ATE measures, processes and usually compares this response data with expected responses. The ATE usually performs these tasks according to a device-specific test program.

ATE's with decentralized resources based on a per-pin architecture are known, wherein during test, each pin of a multiple of pins of the DUT is connected to one ATE pin electronic. The per-pin architecture generally enables high performance and scalability. Examples for ATE with per-pin architecture are the Agilent 83000 and 93000 families of Semiconductor Test Systems of Agilent Technologies. Details of those families are also disclosed e.g. in EP-A-859318, EP-A-864977, EP-A-886214, EP-A-882991, U.S. Pat. No. 5,499,248 and U.S. Pat. No. 5,453,995.

With an increasing complexity of Integrated Circuits, the volume of response data becomes larger. In order to reduce test time in the ATE, data compression is used on DUT side combining a plurality of DUT data sequences into a compressed data sequence that is transmitted to the ATE instead of the plurality of data sequences. This allows for reducing the data rate significantly; however, the compressed data sequence does not allow for deriving detailed error or failure information.

SUMMARY OF THE INVENTION

It is an object of the invention to provide an improved method of detecting errors in compressed data. The object is solved by the independent claims. Preferred embodiments are shown by the dependent claims.

According to an embodiment of the present invention, a device under test—DUT—is connected to automatic test equipment—ATE—for detecting errors in data sequences generated in the DUT in response to a first stimulus signal received from the ATE. The DUT compresses a plurality of these data sequences and provides a corresponding compressed data sequence to the ATE. The ATE compares the first data sequence with expected data stored in a memory and detects the errors in the first data sequence, i.e. the positions where the stored data values do not equal to the received data values. This information allows for detecting error positions, but does not allow for identifying the error source, i.e. the defective data values in the uncompressed data. For detecting the defective data values in the uncompressed data, the ATE generates a second stimulus signal that is based on the first stimulus signal and the detected errors to be provided to the DUT. In response to the second stimulus signal, the DUT generates a second data sequence that comprises uncompressed data of the plurality of the data sequences at the positions where the errors have been detected.

Errors can be spread anywhere in the uncompressed sequences. It is often necessary to acquire uncompressed fail information of each error. The invention allows for a seamless execution of a first production test mode collecting the compressed errors and a subsequent diagnostic test mode based on the detected compressed errors providing a complete set of uncompressed errors.

The DUT is stimulated to provide a complete set of detailed or uncompressed errors without any need to stop the test run for loading new stimulus patterns. The invention thus avoids performing for each error a specific test after time-consuming manipulations of stimuli data or commands at each error point in order to drive the scan chains for each error into the status, where the error was detected in order to get uncompressed fail information.

The invention thus allows for shorting the test-time by creating the necessary environment so that the errors are identified in a first run (production mode), and uncompressed fail information is collected in a single second run (diagnostic mode). The invention thus avoids dead time by waiting for detection and reacting on each individual error.

In an embodiment, the data values of the first data sequence are each functions of the data values of the plurality of internal data sequences at consecutive time positions corresponding to the data rate of the internal data sequences.

In a further embodiment, the first stimulus signal is a data sequence for controlling the DUT to provide the first data sequence at a data rate corresponding to the data rate of the first stimulus signal. The second stimulus signal additionally to the first stimulus signal comprises diagnosis sequences inserted into said data sequence for controlling the DUT to provide the uncompressed data of the plurality of the internal data sequences at the positions of the first sequence, wherein the errors have been detected. This can be achieved either by replacing the error values of the first data sequence (i.e. the data values that have been found to be different from the corresponding expected values) with the values of the internal data sequences at the corresponding error positions or by adding said values of the internal data sequences.

In a further embodiment, the diagnosis sequences of the second stimulus signal comprises a certain number of bits, wherein a first bit sequence indicates to interrupt the internal data sequences at the error positions for each a certain time period (i.e. for a number of clock cycles corresponding to the number of internal data sequences that are used for compression), and a second information to start a diagnosis cycle for generating a sequence of consecutive actual data values of the interrupted internal data sequences to be inserted into the second data sequence.

In a further embodiment, the second data sequence is analyzed for detecting, if one of the plurality of internal data sequences shows a significantly higher error rate compared to one of: an expected error rate and the error rates of other internal data sequences. If such an internal data sequence is detected, the DUT might be instructed to disregard this data stream from compression, i.e. to disconnect a corresponding defective data channel from a compression (or compaction) circuit that generates the compressed (or compacted) first and second data sequence.

The invention can be partly or entirely embodied or supported by one or more suitable software programs, which can be stored on or otherwise provided by any kind of data carrier, and which might be executed in or by any suitable data processing unit, preferably in a control unit of the ATE.

BRIEF DESCRIPTION OF THE DRAWINGS

Other objects and many of the attendant advantages of embodiments of the present invention will be readily appreciated and become better understood by reference to the following more detailed description of preferred embodiments in connection with the accompanied drawing.

FIG. 3 shows a table with values of an exemplary stimulus signal to be provided to the device under test.

DETAILED DESCRIPTION OF THE PREFERRED EMBODIMENT

Figure 1:
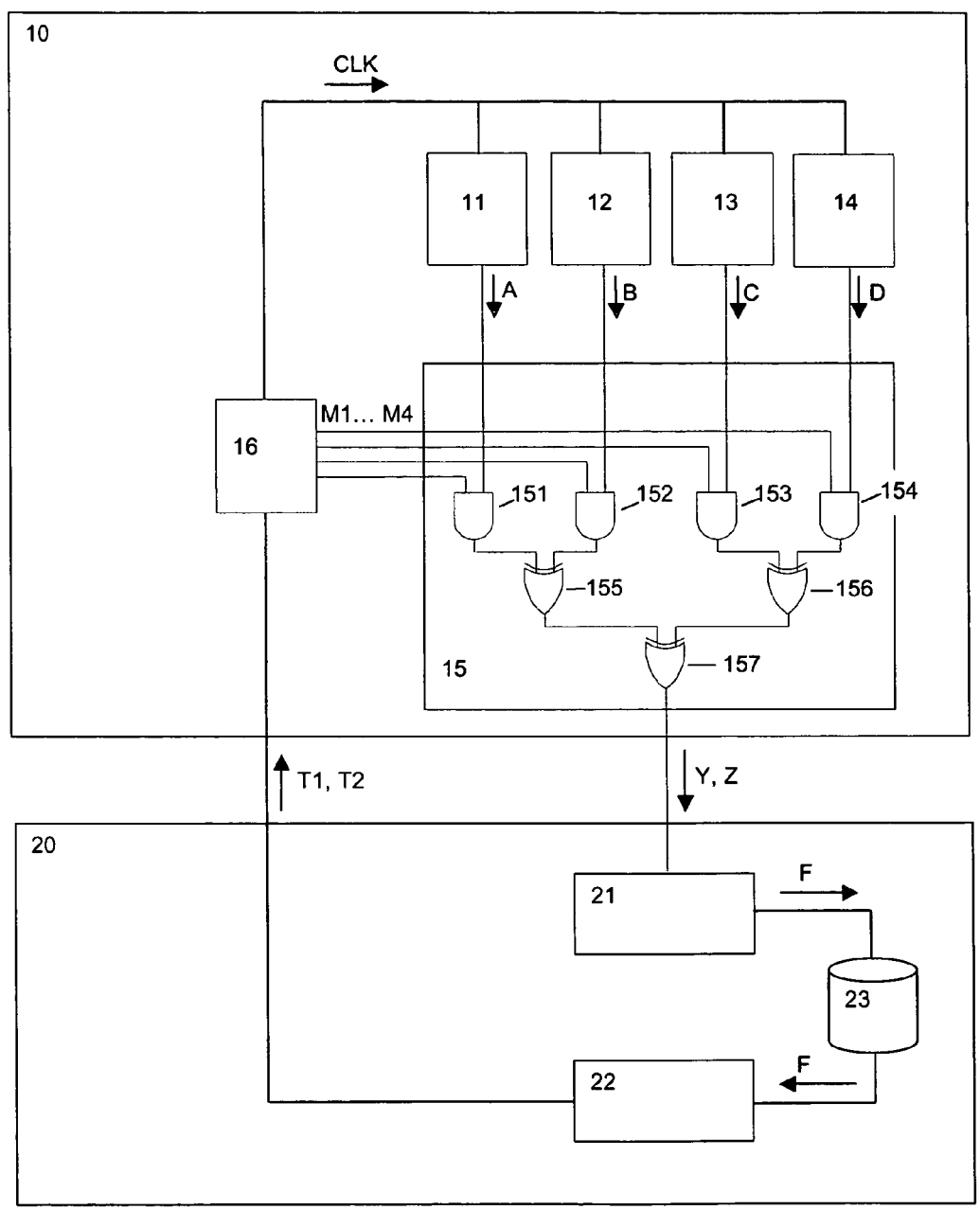
FIG. 1 shows a block diagram of an exemplary test system comprising a device under test and an automatic test equipment.

FIG. 1 shows a test system comprising a device under test—DUT—10 and an automatic test equipment—ATE—20. The DUT 10 provides the ATE 20 with a first and a second (compressed) data sequence Y and Z at an exemplary first DUT terminal in response to a first and a second stimulus signal or test sequence T1 and T2 respectively, received from the ATE 10 at an exemplary second DUT terminal.

The DUT 10 comprises exemplary 4 data channels 11, 12, 13 and 14, a data compression circuit 15, and a compression control circuit 16. Outputs of the data channels 11-14 are connected to the compression circuit 15 to provide each a digital data sequence A, B, C, D to the compression circuit 15. The compression circuit 15 provides at its output the compressed data sequences Y and Z. The compression circuit 15 exemplary comprises four AND gates 151-154 and three XOR (exclusive OR) gates 155-157, each of said gates comprising two inputs and one output. The inputs of the AND gates are each connected to one of the outputs of the data channels 11-14 and to the compression control circuit 16, therewith each receiving one of the data sequences A, B, C, D and one of four control signals M1, M2, M3, M4 provided by the compression control unit 16. The compression control unit 16 receives the first and the second stimulus signal T1 and T2 from the second DUT terminal. The outputs of a first pair of AND gates 151 and 152 are connected to the inputs of a first XOR gate 155 of said XOR gates and the outputs of a second pair of AND gates 153 and 154 are connected to the inputs of a second XOR gate 155 of said XOR gates. The outputs of the first and the second XOR gate 155 and 156 are connected to the inputs of the third XOR gate 157 that provides the compressed data sequences Y and Z at its output to the first DUT terminal.

The ATE 20 comprises an error detection circuit 21 a sequencer 22 and a memory 23. An input of the error detector 21 is connected to the first terminal of the DUT 10, thus receiving the compressed data sequences Y and Z. An output of the error detector 21 is connected to the memory 23 for providing a failure protocol F. This failure protocol F comprises an identification of the error positions detected in the first compressed data sequence Y. The memory 23 is further connected to an input of the test sequencer 22 for transmitting the failure protocol F. An output of the sequencer 22 is connected to the second DUT terminal for providing the control circuit 16 of the DUT 10 with the first and the second test sequence T1 and T2.

The data channels A11-14 of the DUT 10 preferably comprise a plurality of data buffers or data buffers or flip-flops. Depending on the number of flip-flops, the connections between the flip-flops and input signals, each data channel forms a state machine with a certain number of different states. To drive the data channels 11-14 of the DUT 10 into a defined state, a certain stimulus sequence T1 has to be applied to the DUT 10. To read out the states for test purposes, the flip-flops of each data channel are switched to be connected in series to each other forming so-called scan chains. The outputs of the last flip-flops of the scan chains form each the data outputs of the data channels 11-14. With each clock cycle of a DUT clock signal CLK provided to the data channels 11-14, the data information stored in the flip-flops is pushed step by step through the flip-flops of the scan chains, thus forming the uncompressed data sequences A-D at the chain outputs.

All data of the digital data sequences A-D, Y and Z are by way of example binary data that each show one of the two values "0" (logical 0) and "1" (logical one). The values are physically represented e.g. by certain current or voltage levels.

The compression circuit 15 combines at each clock cycle of the clock signal CLK the four digital data values received simultaneously from the data channels 11-14 into one single digital value of the first compressed data sequence Y. FIG. 1 shows by way of example an XOR based compaction circuit 15. The control signals M1-M4 are continuously set to "1" in the production mode. The AND gates 151-154 thus each pass the values of the data sequences to the XOR gates 155 and 156. The output of the first XOR gate 155 shows a "1", if either the actual data value of the first data sequence A or second data sequence B shows a "1"; otherwise, if both shows "0" or "1", the output of the first XOR gate 155 shows "0". The same is true for the second XOR gate 156 with respect to the actual values of the third and fourth data sequences C and D. The output of the third XOR gate 157 shows a "1", if either the output of the first XOR gate 155 or the second XOR gate 156 shows a "1". Thus, the respective value of the first compressed data Y stream shows a "1", if the respective values of the first to fourth data sequences A-B show the values 0001, 0010, 0100, 0111, 1000, 1011, 1101, or 1110 and shows a "0" for the other eight possible sets of values.

As alternative to the XOR scheme shown in FIG. 1, the compression circuit 15 might be based on a Multi-Input-Shift-Register (MISR) scheme. In contrast to an XOR based compactor, which is combinatorial logic, a MISR is a sequential circuit computing a signature based on the uncompressed data streams A-D. In case of using a MISR for compaction, the Most Significant Bit (MSB) of the MISR will provide the data for the compressed data stream Y.

In a first test stage or production mode, the ATE 20 stimulates the DUT 10 for a continuous execution of all test patterns.

In a case of an occurrence of an incorrect (or error) value in on of the data sequences A-D, the respective value of the first compressed data stream Y changes from an expected (correct) value to the other (incorrect) value. The error detector 21 of the ATE 20 compares the received first compressed data stream Y with expected data that might e.g. be stored in a the memory circuit 23. The error detector detects all such errors and provides a failure report or template F comprising the time points or positions of the detected error. As apparent from the description above, it is not possible to directly identify the corresponding uncompressed data sequence that provided the error value to the compression circuit.

The ATE 20 uses the failure template F to prepare a second test sequence T2. This second test sequence T2 shall stimulate the DUT 10 to run the same test as in the production mode, i.e. driving the DUT 10 into the same states. However, at the position where errors have been detected, the DUT shall provide uncompressed error information without any necessity to stop and restart the test run at any error position.

Figure 2:
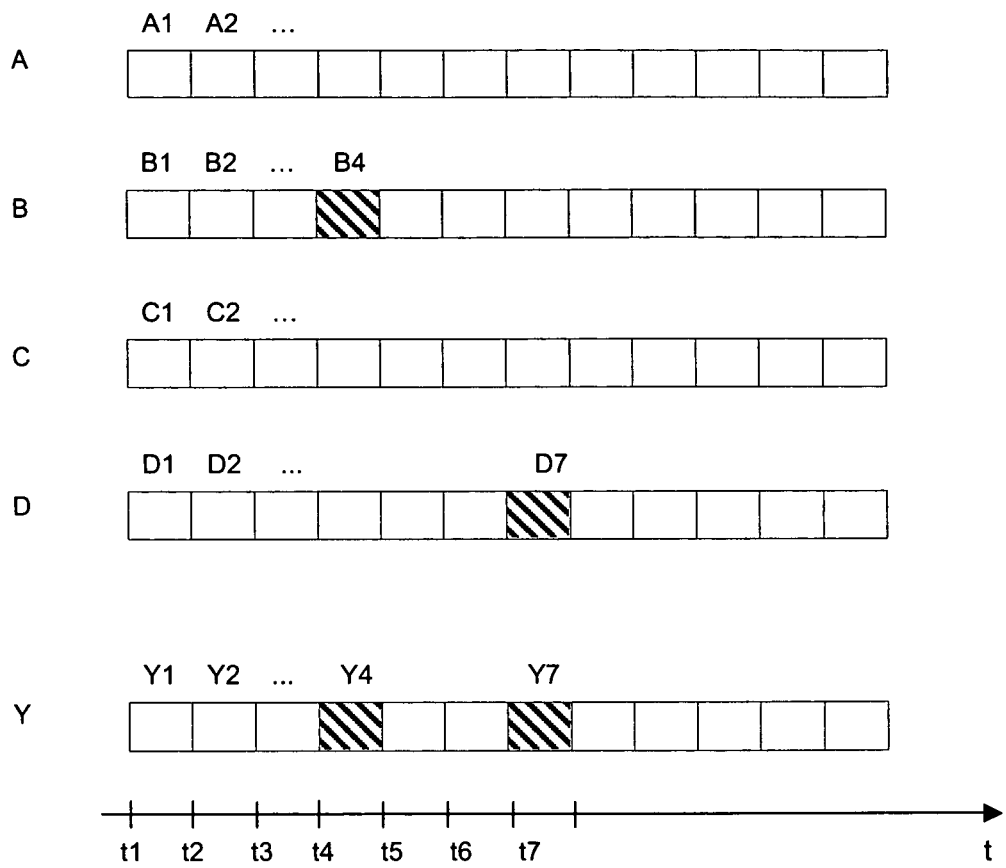
FIG. 2 shows a diagram of exemplary data channel data sequences and a resulting compressed data sequence over the time.

FIG. 2 shows exemplary data sequences A-D and the corresponding compressed data sequence Y over the time t, wherein the values are depicted as cells. Hatched cells B4, Y4, D7 and Y7 shall indicate exemplary incorrect values, whereas the white cells shall indicate correct values. At a first time position t1, the data channels A-D provide each a first data A1-D1, at a second time position t2, the data channels provide each a second data A2-D2, and so forth. The distance between adjacent time positions t1-t8 correspond to the cycle time of the DUT clock CLK. By way of example, the fourth data cell B4 of the second sequence B and the seventh data cell D7 of the fourth sequence D, both corresponding cells being marked as hatched. i.e. they do not show the values that are expected. Consequently, the first compressed sequence Y provided by compression circuit 15 shows errors Y4 and Y7 at the time positions t4 and t7 respectively. The failure template F comprises all the time positions of detected errors.

The failure template F is used by the test sequencer to prepare a diagnostic test run, wherein all uncompressed or detailed errors shall be recovered. The basic algorithm for this diagnostic mode is to run the test similar to the first test, except at the positions where the errors where detected in the production mode. At each error position, the DUT clock CLK shall be stopped and the compression control circuit 16 pass the actual values of all received data sequences A-D to the first DUT terminal. After collection of the uncompressed values, the DUT clock CLK shall be restart to continue compression until the next error.

In an alternative embodiment, with a MISR based compaction as described above, the DUT clock CLK is not stopped at the errors, but is used to sequentially clock out the individual scan chain failures to make those failures observable at the MSB.

Generally, the ATE 20 applies a set of stimuli so that the DUT 10 carries out a diagnostic test-mode with no test-time penalty.

FIG. 3 shows a table with values of an exemplary second stimulus sequence T2 to be provided to the DUT 10 with the XOR based compaction circuit as shown in FIG. 1 as result of the failure protocol F. By way of example, the second stimulus signal T2, also referred to as second test vector, is a sequence of data each comprising three bits T21, T22 and T23. The lowest bit T21 indicates whether the DUT shall be enabled or disabled to provide response data, the second bit T22 indicates whether special diagnosis cycles shall be processed, i.e. whether the DUT shall provide compressed data or uncompressed data, and the third bit T23 indicates whether the DUT clock shall run or stop.

From left to right, in the first column, the positions t1-t8 are denoted, corresponding to the positions t1-t8 of FIG. 2. At the positions t4 and t7, wherein errors have been detected in the first run, each three additional positions t4', t4", t4''' and t7', t7", t7''' are inserted. In the second column indicating the value of the third bit T23 each a value "1" is entered at the positions t1, t2, t3, t5, t6, t8, wherein no errors have been detected and a value "0" is entered at the positions t4-t4''' and t7-t7'''. In the third column indicating whether special diagnosis cycles shall be processed each a value "0" is entered at the positions t1, t2, t3, t5, t6, t8, and a value "1" at the positions t4-t4''' and t7-t7'''. In the fourth column, each a value "1" is entered indicating that the DUT is enabled to perform a test run.

With the third bit T23, the DUT 10 is advised to stop the DUT clock signal CLK to be provided to the data channels 11-14 at each error position. The actual values of the corresponding uncompressed data sequences are thus kept at the input of the compression circuit 15 at each error position.

With the second bit T22, the compression control circuit is advised to start a diagnostic cycle, wherein the actual values of the uncompressed data sequences A-D are passed to the output of the compression circuit 15. In the present example, the compression circuit comprises a counter that is incremented at each clock cycle until a defined maximum value that corresponds to the number of channels 11-14 to be compressed. The control signals M1-M4 to be provided to the compression circuit 15 are a function of the counter, so that the actual values of the uncompressed data sequences A-D are passed one after the other to the output of the compression circuit 15.

Figure 4:
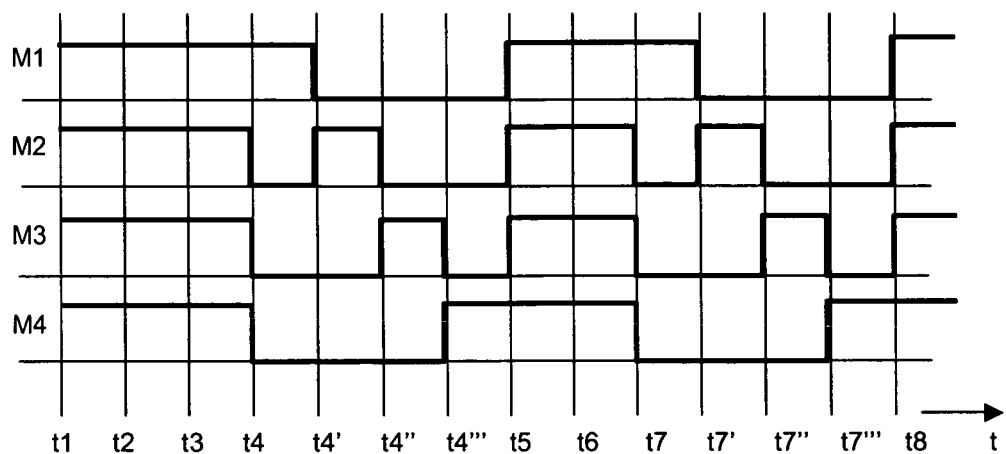
FIG. 4 shows a diagram with exemplary control signals corresponding to the stimulus signal of FIG. 3 for controlling a data compression circuit of the device under test.

FIG. 4 shows a diagram with exemplary digital control signals M1-M4 over the time t corresponding to the stimulus signals of FIG. 3 for controlling the data compression circuit 15. Corresponding to FIG. 3, the time axis is divided into equidistant time positions t1, t2, t3, t4, t4', t4", t4''', t5, t6, t7, t7', t7", t7''', t8. All control signals M1-M4 show the value "1" from t1-t3 and t5-t6. In these time periods, all AND gates 151-154 of the compression circuit 15 pass the corresponding dada values of the data sequences A-D to the following XOR gates 155-157. At the time t4, only the first control signal M1 shows the value "1" while the control signals M2-M4 show the value "0". Thus only the first AND gate 151 passes the actual data value of the first data sequence A to the following XOR gate circuit and the other AND gates block provides a "0". Consequently, the actual data value A4 of the first data sequence A is passed to the output of the compression circuit 15. At the following time position t4', only the second control signal M2 shows the value "1". Therewith, the second AND gate 152 is activated while the other AND gates are blocked and the actual data value B4 of the second data sequence B is passed to the output of the compression circuit 15. At the further following time position t4', only the third control signal shows the value "1". Therewith, the third AND gate 153 is activated while the other AND gates are blocked and the actual data value C4 of the third data sequence C is passed to the output of the compression circuit 15. At the further following time position t4''', only the fourth control signal shows the value "1". Therewith, the fourth AND gate 154 is activated while the other AND gates are blocked and the actual data value D4 of the fourth data sequence D is passed to the output of the compression circuit 15. The same scheme applies for the time positions t7-t7'''.

In an alternative embodiment, the functions of the control circuit 16 are at least partly moved to the ATE 20. Therefore, the ATE 20 generates the control signals M1-M4 that are provided as part of the second stimulus signal T2 to the compression circuit 15 of the DUT 10.

In normal conditions, the error rate of the data channels is expected to be low; it is thus not likely that two channels will show errors at the same time. If however, in contrast to a single flip-flop error or logic error observed by the flip-flop, one of the data channels is completely defective (catastrophic scan chain failure), this channel might produce a data sequence with a high-density error rate. In such case, the ATE 20 might identify the defective channel and provide stimuli signals T1 and T2 that advises the DUT 10 to disconnect the channel from the compression circuit 15. According to the above example, this can be achieved by setting the compression corresponding compression control signal to "0".

The DUT 10 might comprise a plurality of DUT pins, each providing the ATE 20 with compressed data streams. The test vector sequencing per pin allows for testing the plurality of DUT pins independently from each other. Thus it is possible to continue a test run even if a so-called catastrophic failure is detected at one of the plurality of DUT pins.

As result of a first test run, a single failure template F might e.g. comprise up to 200 failures at each DUT pin. The second stimulus signal T2 is generated such that the DUT 10 provides comprehensive uncompressed error information at each identified error in a seamless second test run. The test-time needed for each error is independent from the error location. Up to 200 uncompressed errors information per pin can thus be acquired in a single second run.

What is claimed is:

1. A method of testing a device under test (DUT) in an automatic test equipment (ATE), comprising the steps of:
   receiving a first data sequence from the DUT in response to a first stimulus signal, wherein the first stimulus signal is a data sequence for controlling the DUT to provide the first data sequence at a data rate corresponding to a data rate of the first stimulus signal and wherein the first data sequence comprises compressed data of a plurality of internal data sequences;
   comparing the first data sequence with expected data and detecting at least one error in the first data sequence; and
   providing a second stimulus signal to the DUT in order to instruct the DUT to generate a second data sequence comprising uncompressed data of the plurality of the internal data sequences at a position or positions wherein the at least one error has been detected, wherein the second stimulus signal stimulus is formed by inserting at least one diagnosis sequence into said data sequence of the first stimulus signal for controlling the DUT, to provide the uncompressed data of the plurality of the internal data sequences at the position or positions wherein the errors have been detected.

2. The method of claim 1, wherein data values of the first data sequence are each functions of data values of the plurality of internal data sequences at consecutive time positions corresponding to a data rate of the internal data sequences.

3. The method of claim 1, wherein the second data sequence distinguishes from the first data sequence in that the data values at the position or positions where the at least one error has been detected are replaced by the corresponding data values of the internal data sequences.

4. The method of claim 1, wherein the at least one diagnosis sequence of the second stimulus signal comprises a first information to interrupt a generation of the internal data sequences at the error positions for a certain time period, and a second information to start a diagnosis cycle for generating, a sequence of consecutive actual data values of the interrupted internal data sequences to be inserted into the second data sequence.

5. The method of claim 1, wherein the second data sequence is analyzed detecting to detect if one of the plurality of internal data sequences shows a higher error rate compared to one of: an expected error rate and the error rates of other internal data sequences.

6. The method of claim 5, wherein the DUT is controlled to disregard such an internal data sequence from compression that has been detected to show the higher data rate.

* * * * *